INVENTOR
THOMAS K. LUSBY, JR.

BY

ATTORNEYS

INVENTOR
THOMAS K. LUSBY, JR.

BY
ATTORNEYS

United States Patent Office 3,443,297
Patented May 13, 1969

3,443,297
CIRCUIT MODULE EXTRACTOR
Thomas K. Lusby, Jr., 1120 Country Club Road, Newport News, Va. 23606
Filed July 29, 1966, Ser. No. 568,982
Int. Cl. B25b 27/02
U.S. Cl. 29—203 6 Claims

ABSTRACT OF THE DISCLOSURE

A hand tool for positively and releasably engaging an electronic module to facilitate the engagement of modules with a circuit board and for disengaging modules from a circuit board wherein the modules are normally held in operative position in the circuit board by a plurality of frictional contact pins and receptacles.

The invention described herein was made by an employee of the United States Government and may be manufactured or used by or for the Government without the payment of any royalties thereon or therefor.

This invention relates generally to a hand tool and relates more particularly to a hand tool used to facilitate the removal of integrated circuit modules from electronic circuit boards without damage to the module or circuit board.

The integrated circuit modules presently used in electronic circuit boards have from 8 to 18 contacts holding them flush against the circuit boards. Each contact has a minium holding force of approximately eight ounces thereby producing a total holding force of from four to nine pounds per module. This force must be overcome to remove the module from the circuit board for testing or replacement. The modules must also be removed with a straight even pull, perpendicular to the board, to minimize bending of the contact pins or damage to the bifurcated retention receptacles extending from the board.

The only methods prior to this invention for removing circuit modules were to either pull the circuit modules out with the fingers, or to pry or force the module out with some sharp instrument inserted at various points around the module and using this sharp instrument as a lever. The use of fingers is impossible in the present day design of circuit boards wherein hundreds of modules may be on one board to minimize space requirement and a clearance of only approximately 0.25 inch spacing is provided between adjacent modules. A prying instrument subjects the module, the circuit board, and the contacts to possible damage necessitating the repair or replacement of either or all of them before the modules can be reused. Thus, there is a definite need in the art for a hand tool or instrument to facilitate removal of the circuit modules to minimize any damage to the contacts or circuit board during replacement or repair of the modules. The present invention fulfills this needs in the art.

Accordingly, an object of the present invention is to provide a new and novel hand tool for extracting circuit modules from an electronic circuit board without danger of bending the contact retention pins of the circuit modules.

Another object of the present invention is a novel tool for applying a uniform perpendicular extraction force to an electronic circuit module that is normally held in operative position in a circuit board by a plurality of frictional contact pins and retention receptacles.

A further object of the present invention is a hand tool for extracting individual closely spaced electronic components from a circuit board.

According to the present invention, the foregoing and other objects are attained by providing notches or indentations in the base of the plastic module covering, providing a compact hand tool designed to fit in and engage these notches and exerting a perpendicular extraction force on the module by the hand tool to thereby effect module removal without danger of damage to any of the delicate parts thereof.

A more complete appreciation of the invention and many of the attendant advantages thereof will be more clearly understood by reference to the following detailed description in connection with the drawings wherein.

Figure 1:
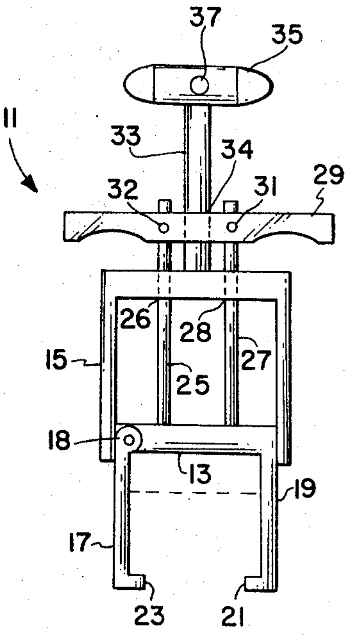
FIG. 1 is a view of the hand tool in accordance with the present invention.
Figure 5:
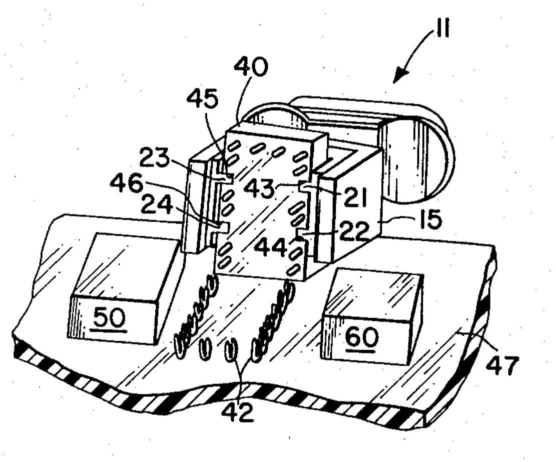

Referring now to the drawings wherein like reference numerals designate identical or corresponding parts throughout the several views, and more particularly to FIG. 1, the hand tool according to the present invention as generally designated by reference numeral 11 and includes a U-shaped yoke 13 and a trammel member 15 slidably received over yoke 13. Yoke 13 is provided with an arm 17, hingedly connected to the yoke bridge at a hinge point and as designated by reference numeral 18, and a fixed arm 19. Each of the arms are provided with a pair of spaced nibs at the free end thereof as designated by reference numerals 21, 22 (FIG. 5), 23 and 24 (FIG. 5). The upper part or bridge of yoke 13 is secured to two pins 25 and 27 that slidably extend in a vertical direction through mating holes 26 and 28, respectively, in trammel member 15. Pins 25 and 27 are received by a transverse finger grip 29 and maintained in fixed position therewith by suitable setscrews 31 and 32. A vertical stem 33 is fixedly secured to the center of trammel 15 at the upper end thereof and slidably received through a suitable central opening 34 provided in finger grip 29. A transverse thumb rest 35 is secured to the end of stem 33 by a suitable setscrew 37.

Figure 2:
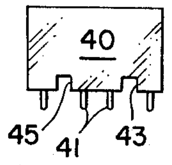
FIG. 2 is a side elevation of a circuit module adapted for use with the hand tool of the present invention.

Referring now to FIG. 2, a circuit module 40, of the type for which hand tool 11 is designed to facilitate extraction thereof, is shown. Module 40 is provided with a plurality of contact pins 41 in the base thereof for maintaining frictional electrical contact of the module in suitable retention receptacle or sockets 42 of an electronic circuit board. Four equally spaced indentations or notches designated by reference numerals 43, 44 (FIG. 5), 45 and 46 (FIG. 5), respectively, are provided in the base of module 40 for the engagement of the hand tool nibs 21, 22, 23 and 24 therein.

*Operation*

Figure 4:
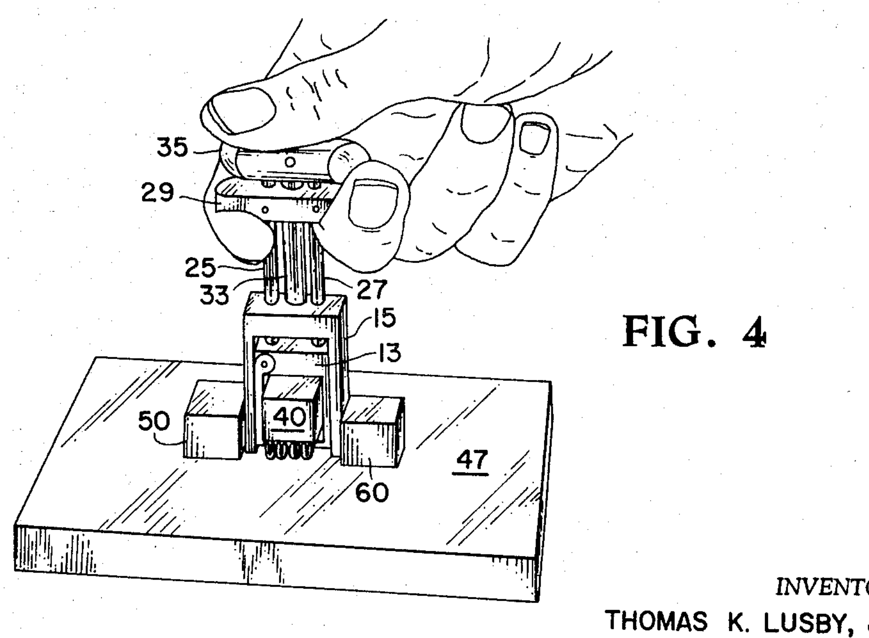
FIG. 4 is a view of the hand tool showing the operation thereof as a module is extracted; and, FIG. 5 is a view of the extracted module as held by the hand tool of the present invention.
Figure 3:
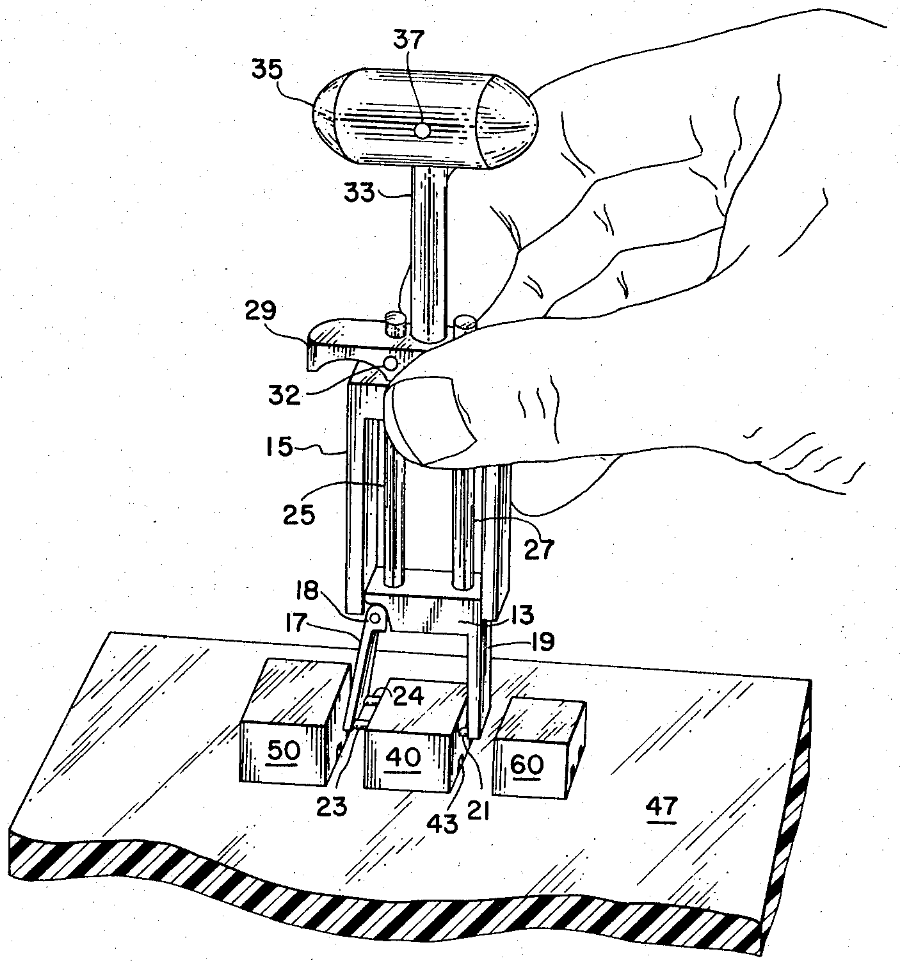
FIG. 3 is a view of the tool shown in FIG. 1 as it is being applied to extract a circuit module of the type shown in FIG. 2.

For purposes of providing a better understanding of the hand tool of the present invention, the operation thereof during a normal circuit module extraction procedure will now be described in relation to FIGS. 3–5. As shown in FIG. 3, a simulated circuit board 47 is shown having three circuit modules 40, 50 and 60 disposed thereon. In actual operation, a circuit board may contain dozens or hundreds of circuit modules but for the sake of clarity only three are shown in the drawings. The circuit modules are disposed at approximately 0.25 inch distance apart in uniform rows and each module is of uniform width with only the number of contacts therein being variable. As mentioned hereinbefore these contacts may vary anywhere in the range of 8–18 for making electrical contacts with the circuit board and serve to hold the modules flush against the board. Each contact in the modules has a minimum holding force of approximately eight ounces to thereby produce a total approximate holding force of from four to nine pounds per module. This force must be overcome to remove the module from the circuit board for testing or replacement and the module must be removed with a straight even pull perpendicular to the board to avoid structural damage. Hand tool 11 performs this function without any danger of damage to the module or circuit board when it is necessary to remove the module from the board for testing or replacement.

Thus, fixed arm 19 of yoke 13 is placed beside the module 40 to be extracted with nibs 21 and 22 thereon being positioned in notches 43 and 44 provided in the base of module 40. Hinged arm 17 on yoke 13 is then pivoted about its hinge point 18 to position nibs 23 and 24 in notches 45 and 46 in the base of module 40. Trammel 15 is then slidably positioned over yoke 13 to hold the arms 17 and 19 thereof in fixed tight engagement with module 40 (FIG. 4). Trammel 15 thus prevents the hinged arm 17 from reopening during the extraction operation. To extract module 40, an operator places his thumb on thumb rest 35 while hooking two fingers under finger grip 29 and, by applying pressure, much like using a syringe or hypodermic needle, trammel 15 is pressed squarely and firmly against circuit board 47 and module 40 is easily and safely extracted by the pull exerted by the fingers on the finger grip 29. The extracted module, with the nibs of hand tool 11 in position therein, is shown more clearly in FIG. 5. A replacement module may then be inserted in position by reversing the extraction steps.

Although the invention has been described in relation to a specific type of module it is readily apparent that the hand tool of the present invention can be adapted for use on any module of this type, either those now in production or those contemplated for the future regardless of the size or number of electrical contacts therein. The only requirement being that suitable notches be provided in the base of the modules for engagement of the hand tool nibs therein.

Since the only force actually applied to the electric module by the hand tool of the present invention is in the base portion thereof, it is readily seen that this tool can be modified for use in extracting electronic tubes and other electronic components of similar configuration and such an adaptation is considered within the scope of the present invention. Although the invention has been described in specific relationship to four nibs, it is readily apparent that this is a matter of design choice and the number of nib contacts employed may be modified without departing from the spirit or scope of the present invention. It is therefore to be understood that, within the scope of the appended claims, the invention may be practiced otherwise than as specifically described.

What is claimed as new and desired to be secured by Letters Patent of the United States is:

1. A hand tool for positively and releasably engaging an electronic module to facilitate the engagement of modules with a circuit board and for disengaging modules from a circuit board wherein the modules are normally held in operative engagement with the circuit board by a plurality of frictional contact pins and receptacles, the improvement comprising:

tool including a yoke for straddling a module,
means on said yoke for positively engaging the module,
means for applying a force to said yoke to thereby perpendicularly extract the module from a circuit board with danger of bending the contact pins and retention receptacles thereof,
said means on said yoke for engaging the module including a plurality of nibs to be received by a plurality of indentations on the circuit module.

2. The hand tool of claim 1 wherein said yoke includes a bridge and a pair of spaced parallel arms depending perpendicular from said bridge, at least one of said arms being hingedly connected to said bridge.

3. The hand tool of claim 1 wherein said means for applying a force to said yoke includes a trammel slideably received over said yoke and adapted to engage the circuit board.

4. The hand tool of claim 3 wherein said yoke is provided with a pair of vertically extending spaced pins, said pins slidably extending through said trammel and terminating in rigid connection with a finger grip, and said trammel is provided with a vertically extending stem, said stem being slidably disposed in said finger grip and terminating in a thumb rest, whereby the extraction force is applied by a tool operator by positioning said yoke over the module, slidably positioning said trammel over said yoke and exerting a pull force on said yoke by said finger grip while exerting a push force on the circuit board through said thumb rest and said trammel.

5. A tool for applying a uniform perpendicular extraction force to an electronic module that is normally held in operative position in a circuit board by a plurality of frictional contact pins and retention receptacles, comprising in combination with said module:

a yoke member adapted to straddle said electronic module,
a pair of nibs on each of the arms of said yoke at the free end thereof,
at least one of the arms of said yoke being pivotally secured to the yoke bridge,
a pair of pins rigidly attached at one end and extending upwardly from said yoke bridge,
a transverse finger grip member secured to the other end of said pins,
a trammel slideably received over said yoke and having openings therein for slideably receiving said pair of pins, and
a stem extending from said trammel and terminating in a transverse thumb rest member.

6. A hand tool for extracting individual electronic modules from a circuit board having a plurality of electronic modules that are each normally held in operative position thereon by a plurality of frictional contact pins and receptacles wherein said individual modules are extracted from said circuit board without danger of damage to the module extracted or those modules adjacent thereto, said tool including a yoke for straddling said module,
means on said yoke for engaging said module, and
means for applying a perpendicular extraction force to said yoke to thereby extract said module from said circuit board without danger of bending the contact retention pins thereof.

References Cited

UNITED STATES PATENTS

| | | | |
|---|---|---|---|
| 3,117,370 | 1/1964 | Kauppi et al. | 29—206 |
| 3,317,989 | 5/1967 | Cull | 29—203 |

THOMAS H. EAGER, *Primary Examiner.*

U.S. Cl. X.R.

29—206